(12) United States Patent
Mounioloux

(10) Patent No.: US 11,864,346 B2
(45) Date of Patent: *Jan. 2, 2024

(54) PUMP-DRIVEN COOLANT FILLING DEVICE AND METHODS

(71) Applicant: Rouchon Industries Inc., Anaheim, CA (US)

(72) Inventor: Stephen Mounioloux, Anaheim, CA (US)

(73) Assignee: Rouchon Industries, Inc., Anaheim, CA (US)

( * ) Notice: Subject to any disclaimer, the term of this patent is extended or adjusted under 35 U.S.C. 154(b) by 249 days.

This patent is subject to a terminal disclaimer.

(21) Appl. No.: 17/516,075

(22) Filed: Nov. 1, 2021

(65) Prior Publication Data

US 2022/0369508 A1 Nov. 17, 2022

Related U.S. Application Data

(62) Division of application No. 17/322,596, filed on May 17, 2021, now Pat. No. 11,172,592.

(51) Int. Cl.
*H05K 7/20* (2006.01)
*F04D 29/42* (2006.01)
(Continued)

(52) U.S. Cl.
CPC .......... *H05K 7/20272* (2013.01); *F04D 1/00* (2013.01); *F04D 13/021* (2013.01); *F04D 29/007* (2013.01); *F04D 29/22* (2013.01); *F04D 29/2222* (2013.01); *F04D 29/40* (2013.01); *F04D 29/4293* (2013.01); *H05K 5/023* (2013.01); *H05K 7/20327* (2013.01); F04D 5/007 (2013.01); F04D 29/00 (2013.01);
(Continued)

(58) Field of Classification Search
CPC .......... H05K 7/20272; H05K 7/20327; H05K 5/023; F04D 1/00; F04D 13/021; F04D 29/007; F04D 29/22; F04D 29/2222; F04D 29/40; F04D 29/4293; F04D 29/00; F04D 29/005; F04D 29/2216; F04D 29/406; F04D 5/007
USPC ..................................................... 165/104.31
See application file for complete search history.

(56) References Cited

U.S. PATENT DOCUMENTS 7,052,509 B2 * 5/2006 Lennox ................. A61F 7/0085
607/104
10,800,644 B2 * 10/2020 Hikem .................... G16Z 99/00
(Continued)

*Primary Examiner* — Joel M Attey
(74) *Attorney, Agent, or Firm* — Holland & Knight, LLP; Matthew C. Cox

(57) ABSTRACT

A system for cooling a circuit component on an electronic device includes a closed-loop cooling circuit and a coolant filling device. The closed-loop cooling circuit includes a coolant block, a first pump and a radiator. The coolant filling device includes a container, a base and a second pump disposed inside the base. The coolant filling device is configured for attachment to the cooling circuit. In some embodiments, when the coolant filling device is attached to the cooling circuit, coolant may be circulated from the coolant filling device to the cooling circuit while the cooling circuit circulates coolant. In further embodiments, when the coolant filling device is attached to the cooling circuit, coolant may be circulated from the coolant filling device to the cooling circuit while the electronic device remains powered on.

20 Claims, 16 Drawing Sheets

(51) Int. Cl.

| | |
|---|---|
| *F04D 1/00* | (2006.01) |
| *F04D 29/22* | (2006.01) |
| *F04D 29/40* | (2006.01) |
| *F04D 13/02* | (2006.01) |
| *F04D 29/00* | (2006.01) |
| *H05K 5/02* | (2006.01) |
| *F04D 5/00* | (2006.01) |

(52) U.S. Cl.
CPC ........ *F04D 29/005* (2013.01); *F04D 29/2216* (2013.01); *F04D 29/406* (2013.01)

(56) References Cited

U.S. PATENT DOCUMENTS

| | | | | |
|---|---|---|---|---|
| 2004/0118940 | A1* | 6/2004 | Lavitt | B05B 9/0861 239/302 |
| 2005/0217828 | A1* | 10/2005 | Tomioka | G06F 1/203 165/104.31 |
| 2014/0353339 | A1* | 12/2014 | Madjar | A47G 19/2272 222/333 |

* cited by examiner

PUMP-DRIVEN COOLANT FILLING DEVICE AND METHODS

CROSS-REFERENCES TO RELATED APPLICATIONS

This application is a divisional of U.S. patent application Ser. No. 17/322,596 filed May 17, 2021 entitled PUMP-DRIVEN COOLANT FILING DEVICE AND METHODS, which is hereby incorporated by reference in its entirety.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH DEVELOPMENT

None.

REFERENCE TO SEQUENCE LISTING OR COMPUTER PROGRAM LISTING APPENDIX

None.

BACKGROUND

The present invention relates to devices and methods for handling coolant and more particularly to devices and methods for handling liquid coolant in liquid-cooled electronics cooling circuits or other applications requiring use of liquid coolant.

Many devices in different industries require liquid coolant. Computer and electronic devices such as computer processors and other circuit board components generate heat. In many applications, thermal effects limit processing capacity and can lead to undesirable performance effects such as slow computing speeds or thermal damage to components. To overcome thermal effects, computing devices commonly include active cooling devices such as fans that blow air over processors or other circuit components to remove heat. However, conventional air-cooled thermal management solutions are often inadequate to remove excess heat due to mechanical heat transfer limits of forced air convection.

Active liquid-cooled solutions provide much better heat transfer and cooling performance for computers and electronics as compared to conventional air-cooled solutions. Liquid-cooled systems typically include a heat exchanger block that may be placed in direct or indirect thermal contact with a circuit component such as a processor. A thermally conductive liquid coolant is circulated through the block using a pump, and excess liquid coolant may be contained in a reservoir. In some embodiments, the liquid coolant is passed through a radiator downstream of the block. Forced air may be blown over the radiator to remove heat from the liquid coolant as the coolant passes through the radiator.

Active liquid-cooled systems typically include a closed-loop liquid circuit. Over time, liquid coolant in the closed-loop circuit may evaporate, become contaminated, or excess air pockets may form in the fluid circuit. In such instances, it is necessary to add additional coolant to the closed-loop fluid circuit or change the coolant. The present invention relates to devices and methods for adding, removing or changing liquid coolant in closed-loop active liquid-cooling circuits for electronics.

Conventional devices and methods for adding, removing or changing coolant in a fluid circuit are problematic because they generally require a user to power down the electronics before adding, removing or changing the coolant fluid. This can be a problem, for example, in coolant circuits for computers or servers where hardware downtime is undesirable. For example, shutting down electronics to enable coolant changes may lead to cascading effects that require additional electronics to be powered down, may cause users to lose connectivity, and may lead to significant economic losses or even damage to hardware or software in some instances.

Another common problem with conventional devices and methods for adding, removing or changing coolant in a fluid circuit is spillage. When adding, removing or changing liquid coolant, fluid must be transferred between the closed-loop cooling circuit and an external coolant reservoir, such as a bottle or container of new or used coolant. The conventional method of attempting to pour the new coolant into a receptacle on the closed-loop circuit using a funnel or spout often leads to coolant spillage. In many applications, coolant may cause damage to the electronics or cause a mess that must be cleaned, leading to more downtime. Additionally, coolant may be hazardous to people in some applications, and human exposure to liquid coolant is undesirable.

What is needed, then are improvements in devices and methods for quickly and easily filling liquid coolant circuits for electronic devices or other industrial applications.

BRIEF SUMMARY

One aspect of the present disclosure provides a pump-driven coolant filling device. The device includes a coolant container that screws into a base with an integrated pump. First and second hoses extend from the base with quick connect hose fittings on each end to provide interconnection with a liquid cooling fluid circuit. Once the hoses are connected to the circuit, the pump may be activated to provide positive pressure driven or negative pressure driven coolant flow to the fluid circuit.

In some aspects of the disclosure, which may be combined with any other aspect listed herein unless specified otherwise, a pressure driven coolant filling device is disclosed. The device includes a container and a base. The base includes an integrated pump, a power supply and a handle.

In a second aspect of the disclosure, which may be combined with any other aspect listed herein unless specified otherwise, a method of filling a liquid coolant circuit includes providing a positive or negative pressure driven coolant filling device with an integrated pump, attaching the device to the circuit, and filling the circuit with coolant using the pump while the circuit remains on.

The advantages discussed herein may be found in one, or some, and perhaps not all of the aspects disclosed herein. Additional features and advantages are described herein, and will be apparent from, the following Detailed Description and the Figures.

BRIEF DESCRIPTION OF THE DRAWINGS

The accompanying drawings, which are incorporated herein and constitute part of this specification, illustrate certain preferred aspects of the invention, and, together with the general description given above and the detailed description given below, serve to explain the features of the invention. In the drawings.

DETAILED DESCRIPTION

While the invention is described in connection with certain preferred aspects, it is not intended that the present invention be so limited. On the contrary, it is intended to cover all alternatives, modifications, and equivalent arrangements as may be included within the spirit and scope of the invention as defined by the appended claims.

The drawings provide illustrative, non-limiting aspects of the present invention setting forth an exemplary packaging and display apparatus and associated methods. Certain terminology is used herein for convenience only and is not to be taken as a limitation on the present invention. While the following describes certain illustrative aspects of the present invention, it should be understood, based on this disclosure that the invention is described by the claims, and is not limited by the aspects described herein.

Figure 1:
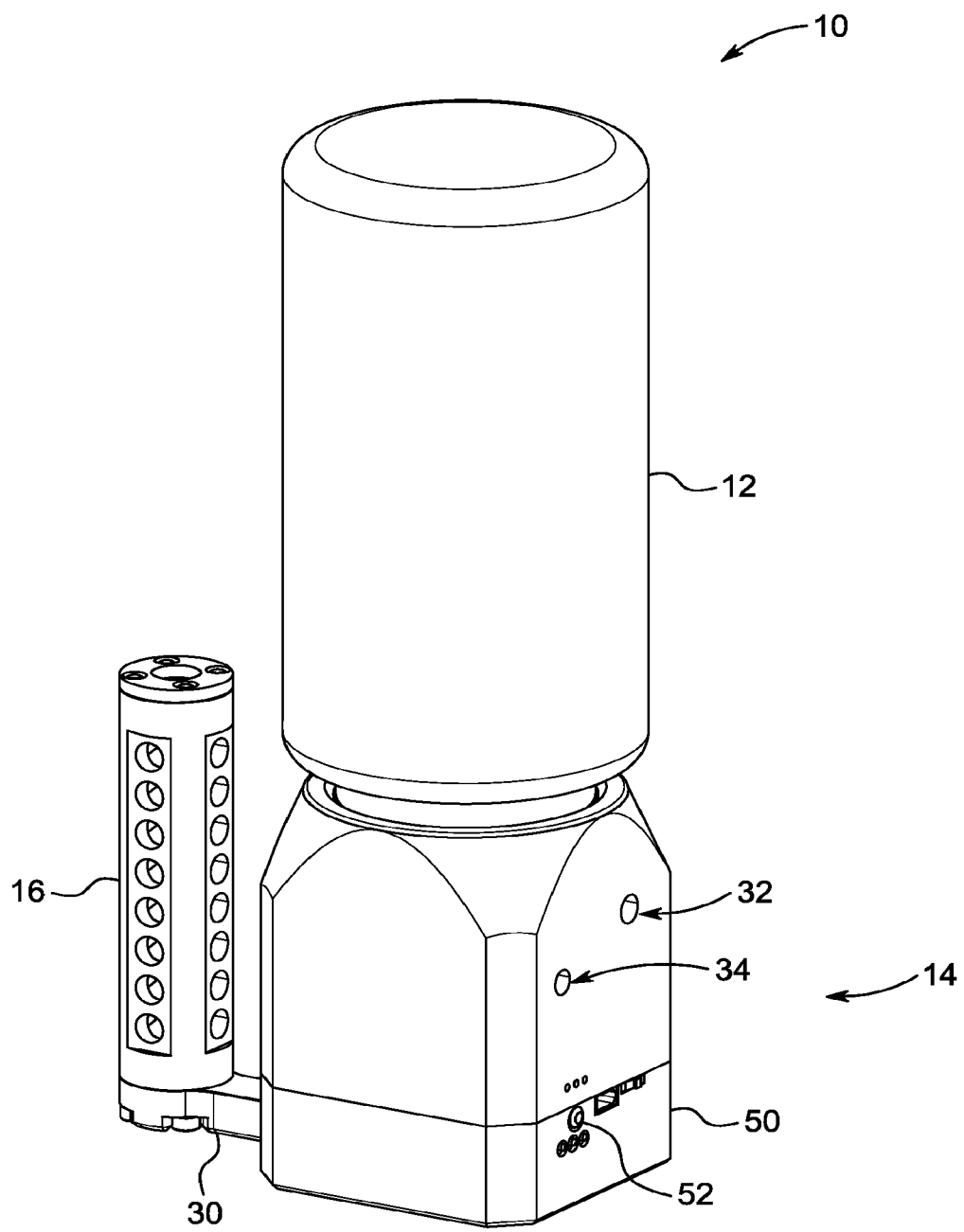
FIG. 1 is a perspective view of an embodiment of a pump driven coolant filling device with a container, a base and a handle.
Figure 2:
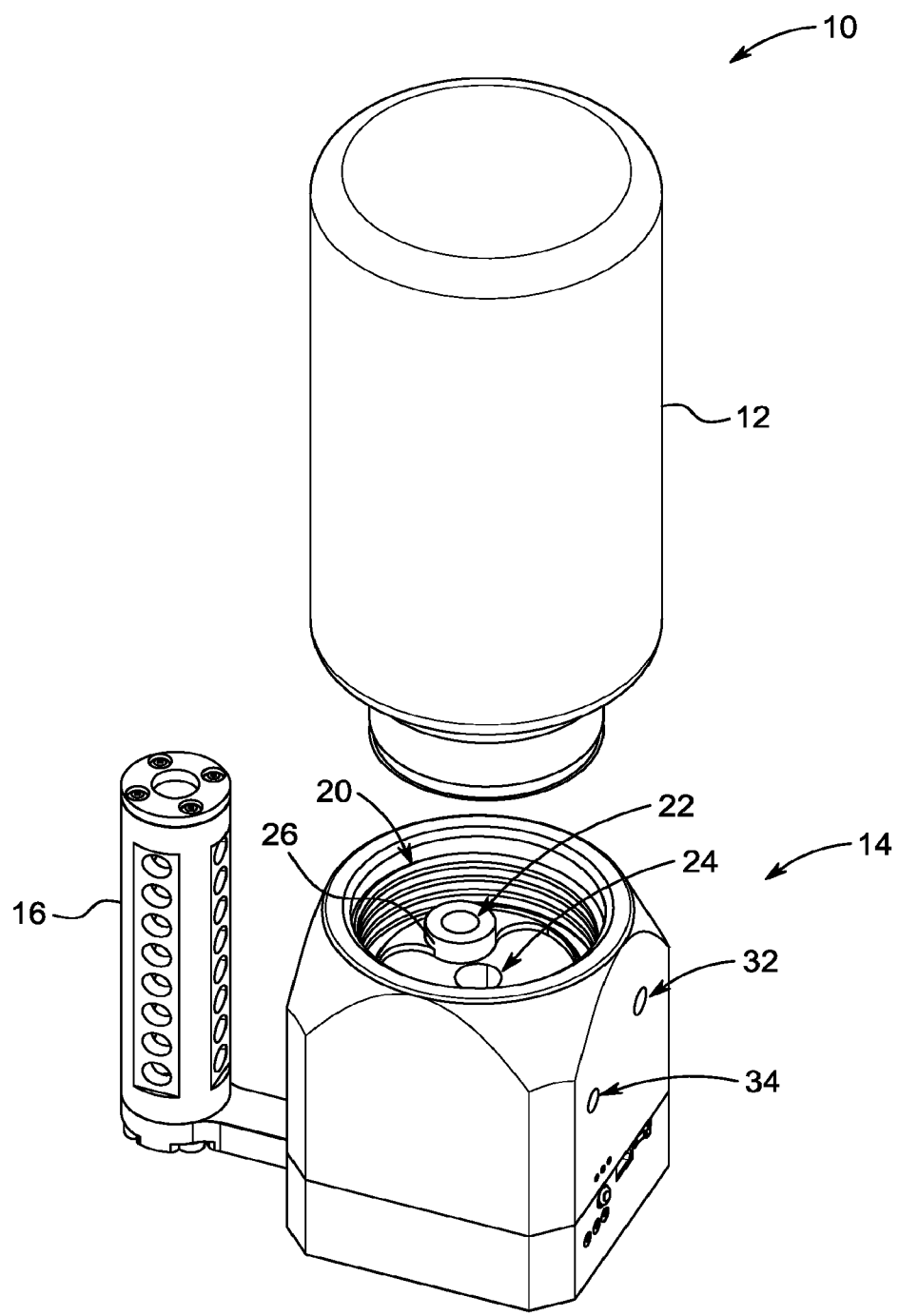
FIG. 2 is a partially exploded view of the embodiment of the device shown in FIG. 1.

Referring to FIGS. 1 and 2, an embodiment of a pump-driven coolant filling device 10 is shown. Device 10 includes a coolant container 12 and a base 14. Coolant container 12 may include a disposable bottle pre-filled with coolant in some embodiments. In other embodiments, coolant container 12 includes a re-usable bottle. Container 12 may include any suitable container for storing or housing coolant known in the art.

Container 12 is mounted into a container socket 20 defined in base 14. Base 14 may be inverted relative to container 12, base 14 and container 12 may be threaded together via corresponding threads disposed inside socket 20 and on the neck of container 12. Once combined, the assembly may then be rotated such that container is above base, as shown in FIG. 1.

A handle 16 is disposed on base 14 to allow a user to easily handle the assembly during use. A flange 30 extends from base 14 in some embodiments, and handle 16 is disposed on flange 30.

During use, liquid coolant contained in container 12 is fed by gravity downwardly into base 14. Liquid coolant is driven by a pump inside base 14 to fill a coolant circuit. Liquid coolant may flow through base 14 via first and second filling ports 32, 34. In some embodiments, first filling port 32 is an inlet port that receives returning coolant from the cooling circuit, and second filling port 34 is an outlet port that sends coolant to the cooling circuit. In other embodiments, these are reversed.

First and second socket openings 22, 24 are defined in the lower end of socket 20. First socket opening 22 is in fluid communication with first filling port 32, and second socket opening 24 is in fluid communication with second filling port 34. Liquid coolant may travel between each corresponding opening and filling port pair. For example, returning coolant may flow into base 14 though first filling port 32 and flow out of first socket opening 22 back into container 12. Similarly, outgoing coolant may flow from container 12 down into second socket opening 24 and flow out of second filling port 34.

Referring to FIG. 2, in some embodiments, a boss 26 extends upwardly from the lower end of socket 20, and first socket opening 22 is defined through boss 26. By positioning first socket opening 22 above the lower end of socket 20, upward flow of return coolant into container 12 may be improved to prevent return coolant from immediately entering second socket opening 24.

Figure 3:
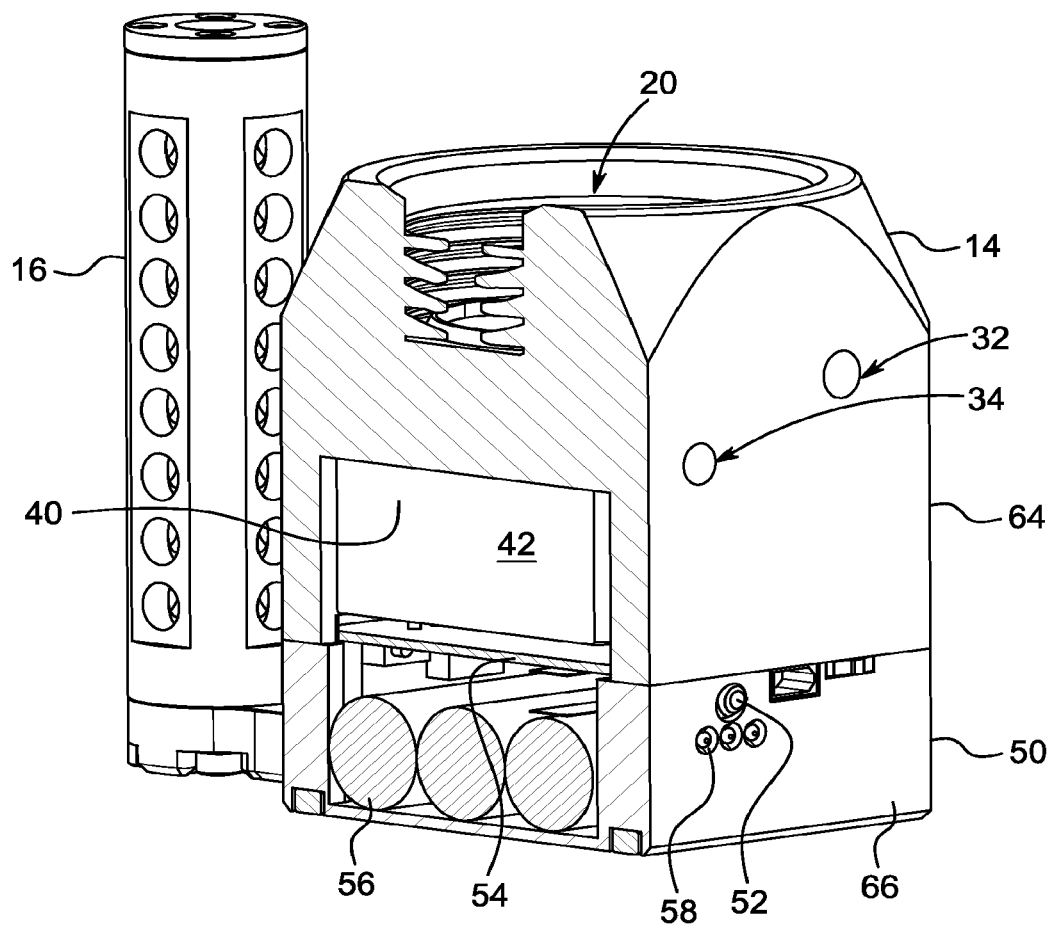
FIG. 3 is a partial cross-sectional perspective view of an embodiment of a base for a coolant filling device.

Referring to FIG. 3, an embodiment of a base 14 is shown in a partial cross-sectional view. Base 14 includes an integrated pump assembly 40 disposed inside base 14. Pump assembly 40 is housed inside an upper base housing 64 that also includes socket 20 and first and second filling ports 32, 34. Pump assembly 40 includes a positive or negative pressure pump configured to force coolant flow out of base 14 into a cooling circuit.

A power supply 50 is also disposed on base 14. Power supply 50 provides power to pump assembly 40. Power supply 50 is disposed in a lower base housing 66 below pump assembly 40 in some embodiments. Power supply 50 includes one or more cells 56 configured to provide power. In some embodiments cells 56 are rechargeable battery cells. In other embodiments, cells 56 are replaceable batteries. Power supply 50 includes any suitable power supply.

In some embodiments, a switch 52 and one or more indicator lights 58 are disposed on power supply 50. Switch 52 may be configured to control operation of power supply 50 or pump assembly 40 in some embodiments. Indicator lights 58 are configured to display a signal corresponding to an operational state of the device 10, such as low battery, charged, charging, on, off or any other state of the device.

Figure 4:
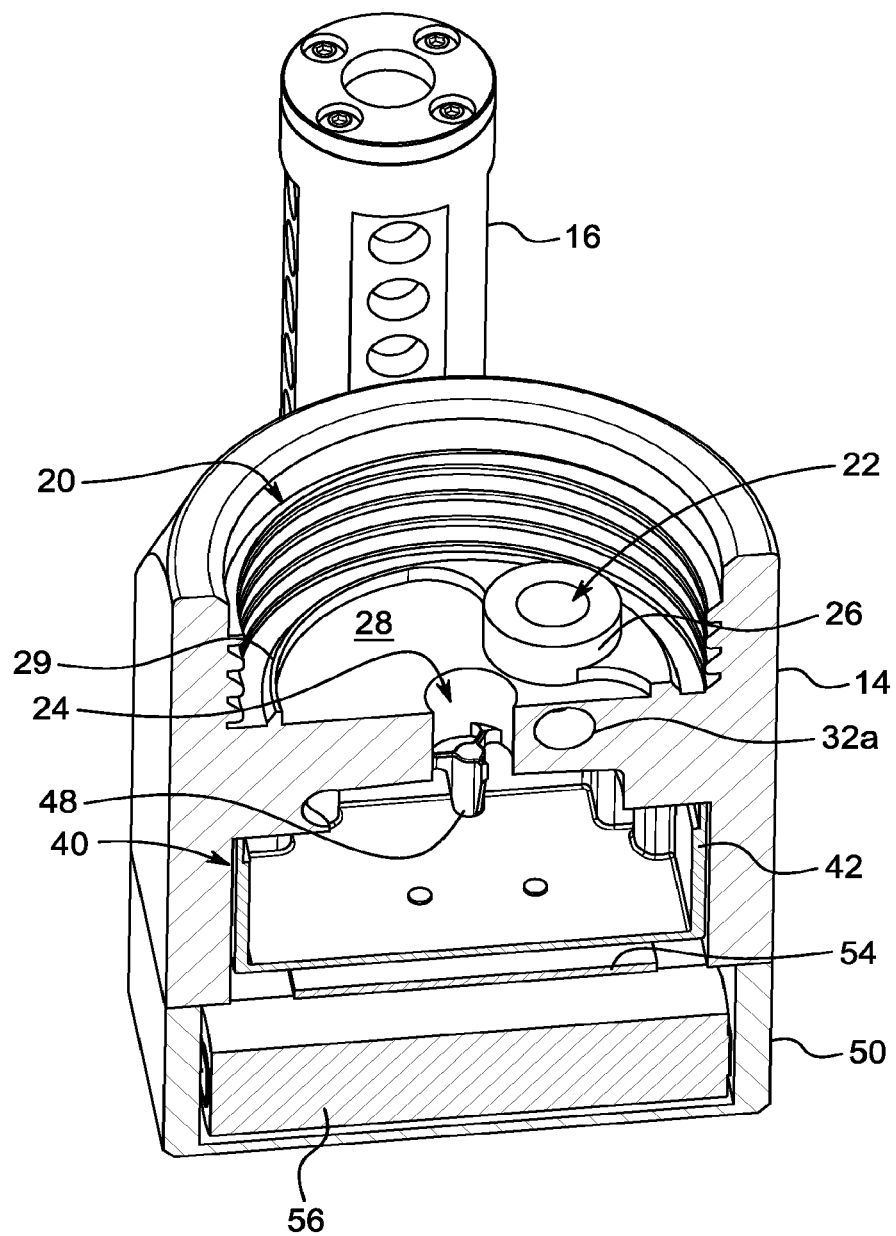
FIG. 4 is a partial cross-sectional perspective view of an embodiment of a base for a coolant filling device.

Referring to FIG. 4, base 14 includes socket 20 having a lower end wall 28. In some embodiments, an annular sealing ring 29 extends upwardly from lower end wall 28 in a ring around first and second openings 22, 24. Sealing ring 29 includes an inclined outer edge sloping downwardly to provide an enhanced seal with the inner neck of container 12. When container 12 is threaded onto base 14, the neck of container 12 is fully seated into socket 20 such that the container neck engages sealing ring 29 at lower end wall 28. Sealing ring 29 prevents leakage of coolant and provides a seal between base 14 and container 12.

Referring further to FIG. 4, first filling port 32a extends through base 14 and is in fluid communication with first socket opening 22 such that liquid coolant travelling into base 14 passes up through first socket opening 22 into container 12. Second socket opening 24 is positioned such that liquid coolant exits container 12 and passes down into the pump assembly. Coolant passes through second socket opening 24 and passes downwardly past impeller pivot 48 in some embodiments. Pump assembly 40 includes a pump housing 42 located directly below second socket opening 24. A circuit board 54 is disposed below pump housing 42 in some embodiments, and power supply 50 and cell 56 are disposed below the circuit board.

Figure 5:
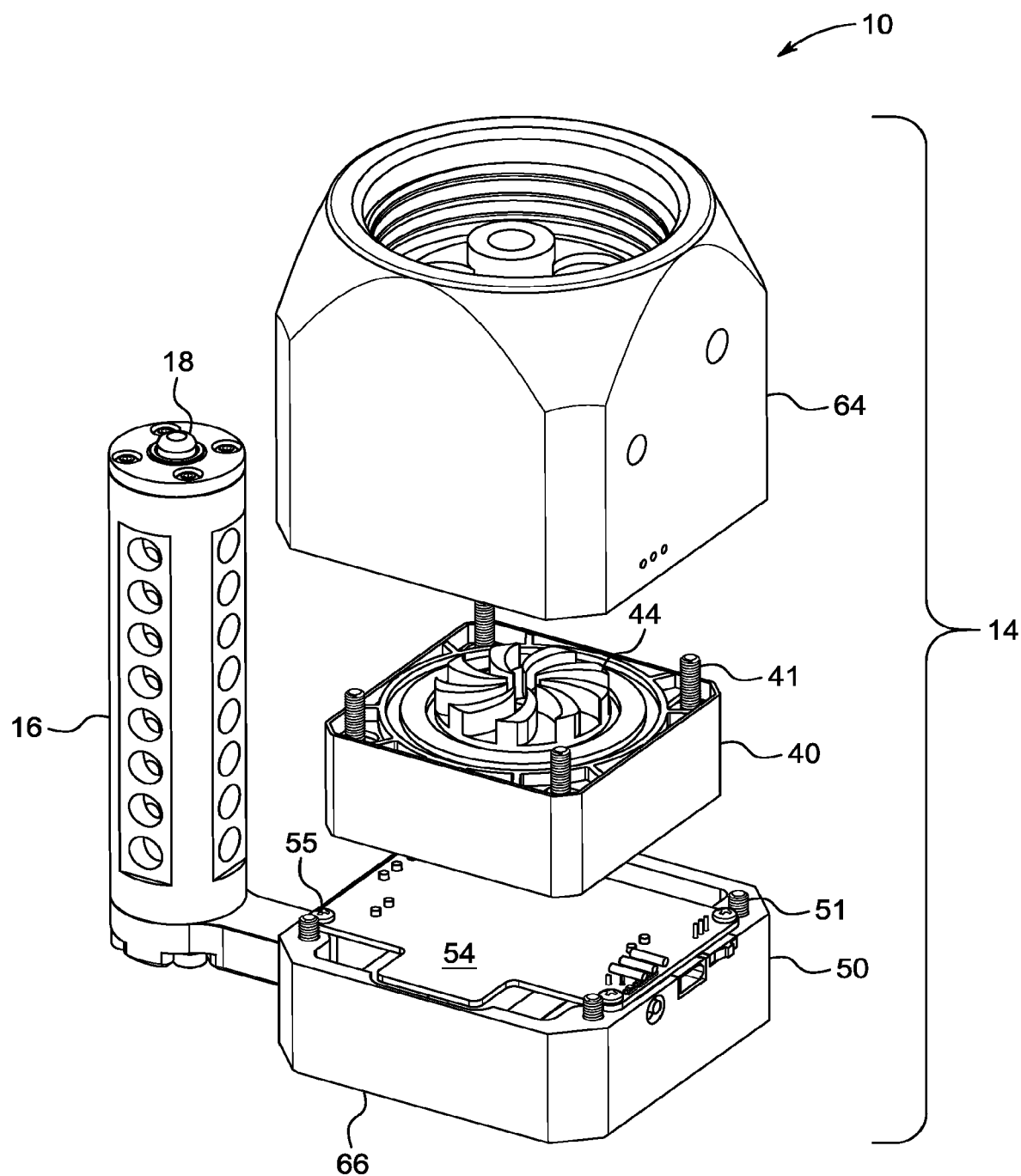
FIG. 5 is a partial exploded perspective view of an embodiment of a base for a coolant filling device.
Figure 6:
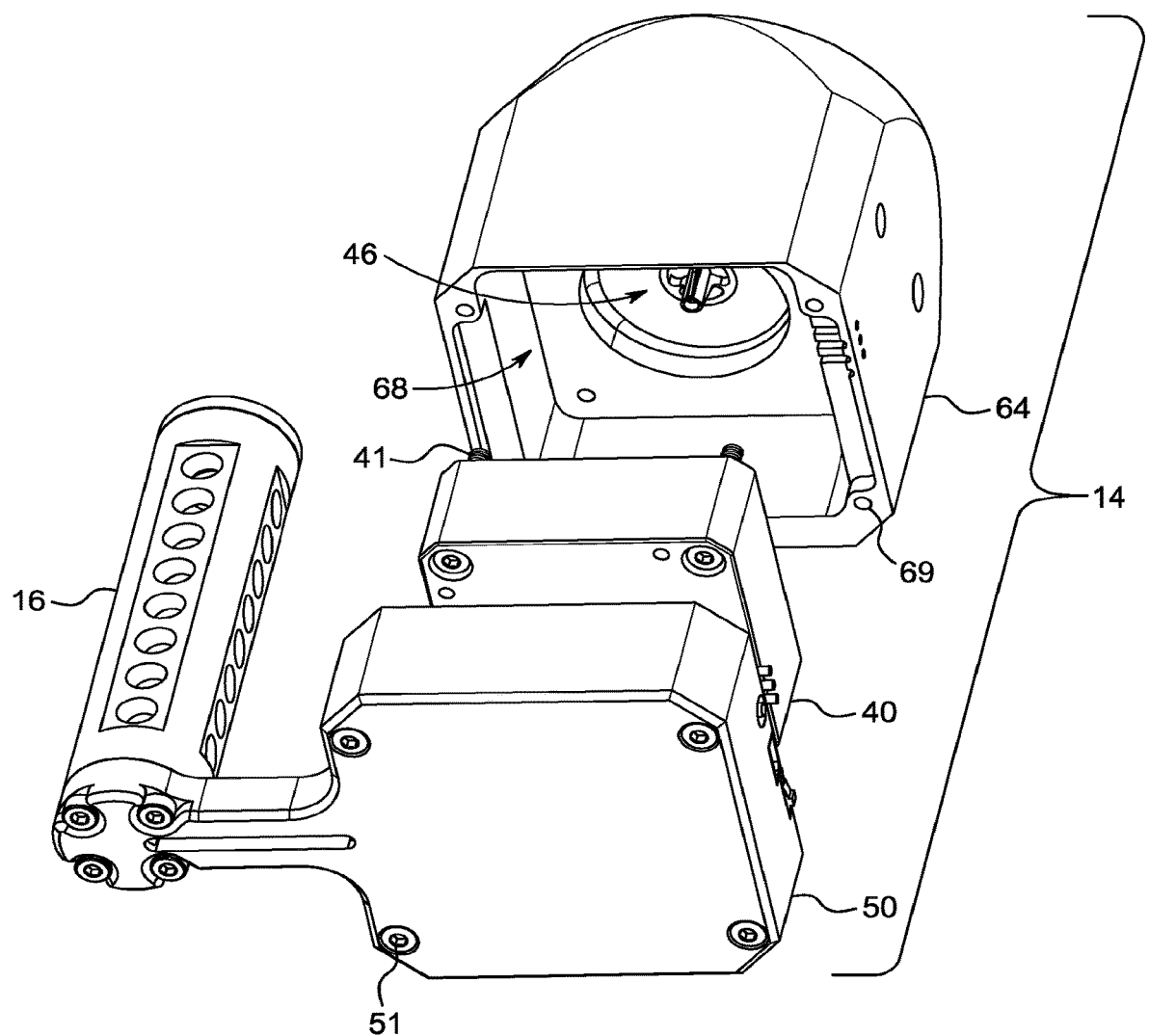
FIG. 6 is a partial exploded perspective view of an embodiment of a base for a coolant filling device.

Referring to FIG. 5 and FIG. 6, device 10 includes a base 14 having an upper base housing 64 and a lower base housing 66. A pump assembly 40 is disposed inside a pump recess 68 defined in the underside of upper base housing 64. Pump assembly 40 includes an impeller 44 in some embodiments. Impeller 44 fits inside and rotates in an impeller socket 46 defined in upper base housing 64. Pump assembly 40 is secured to upper base housing 64 from underneath using one or more pump assembly fasteners 41 that extend upwardly into corresponding threaded bores 69 integrally formed in upper base housing 64 in some embodiments. Pump assembly 40 is secured to upper base housing 64 forming an integrated pump inside base 14.

Figure 7:
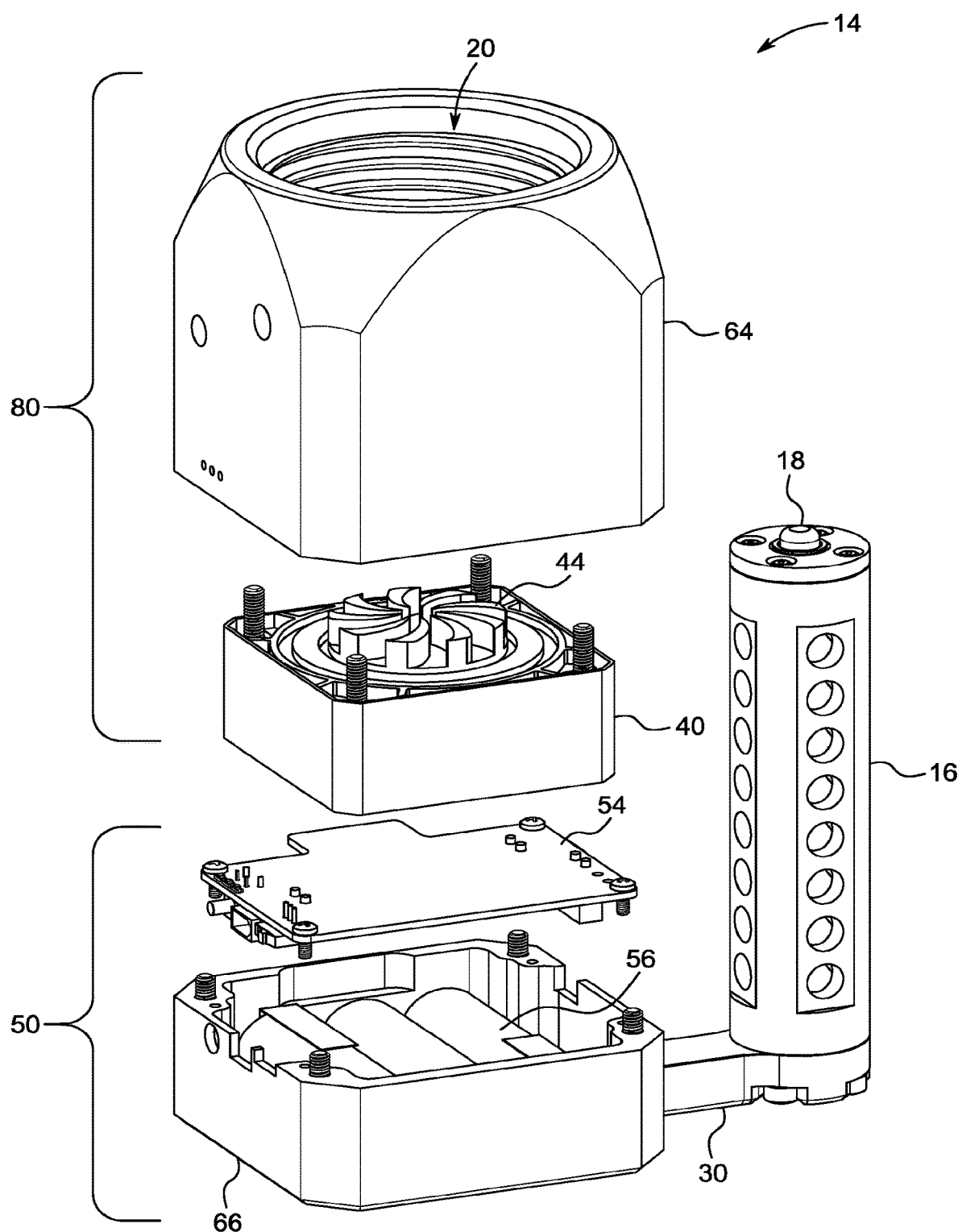
FIG. 7 is a partial exploded perspective view of an embodiment of a base for a coolant filling device.

Referring to FIGS. 5-7, lower base housing 66 includes a power supply 50 and a circuit board 54. Circuit board 54 is secured to lower base housing 66 using one or more circuit board fasteners 55. Lower base housing 66 includes pump 50 and handle 16. In some embodiments, a handle switch 18 is disposed on handle 16 to selectively control operation of pump 50. Lower base housing 66 is secured to upper base housing 64 using one or power supply fasteners 51.

As shown in FIG. 7, in some embodiments, base 14 can be described as having two sections: a pump 80 and a power supply 50. Pump 80 and power supply 50 are coupled together to form base 14. Pump 80 includes an upper base housing 64 and an integrated pump assembly 40 having an impeller 44. Power supply 50 includes a lower base housing 66, a battery cell 56, a circuit board 54 and a handle 16.

Figure 8:
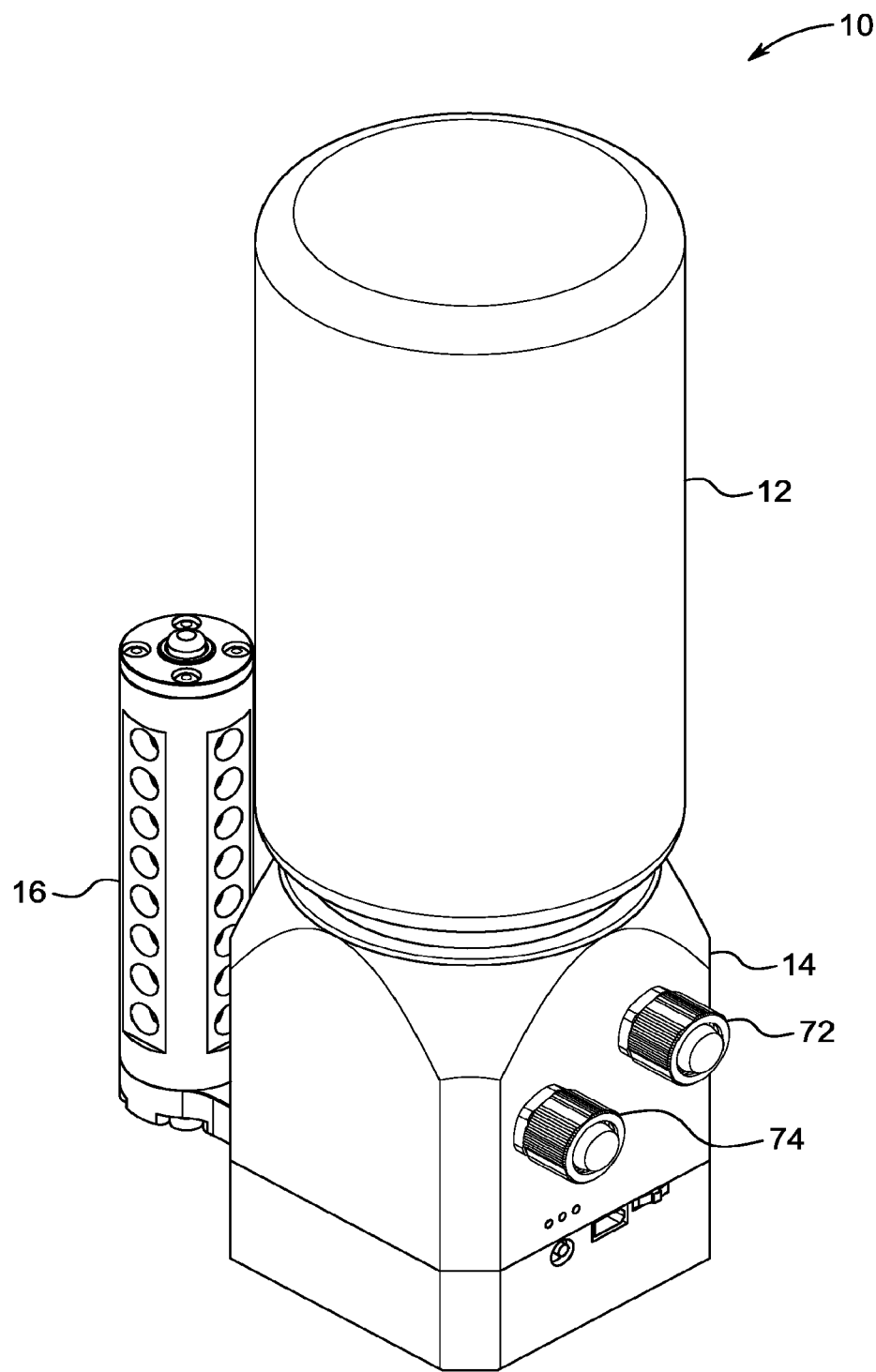
FIG. 8 is a perspective view of an embodiment of a pump driven coolant filling device with a container, a base and a handle.
Figure 9:
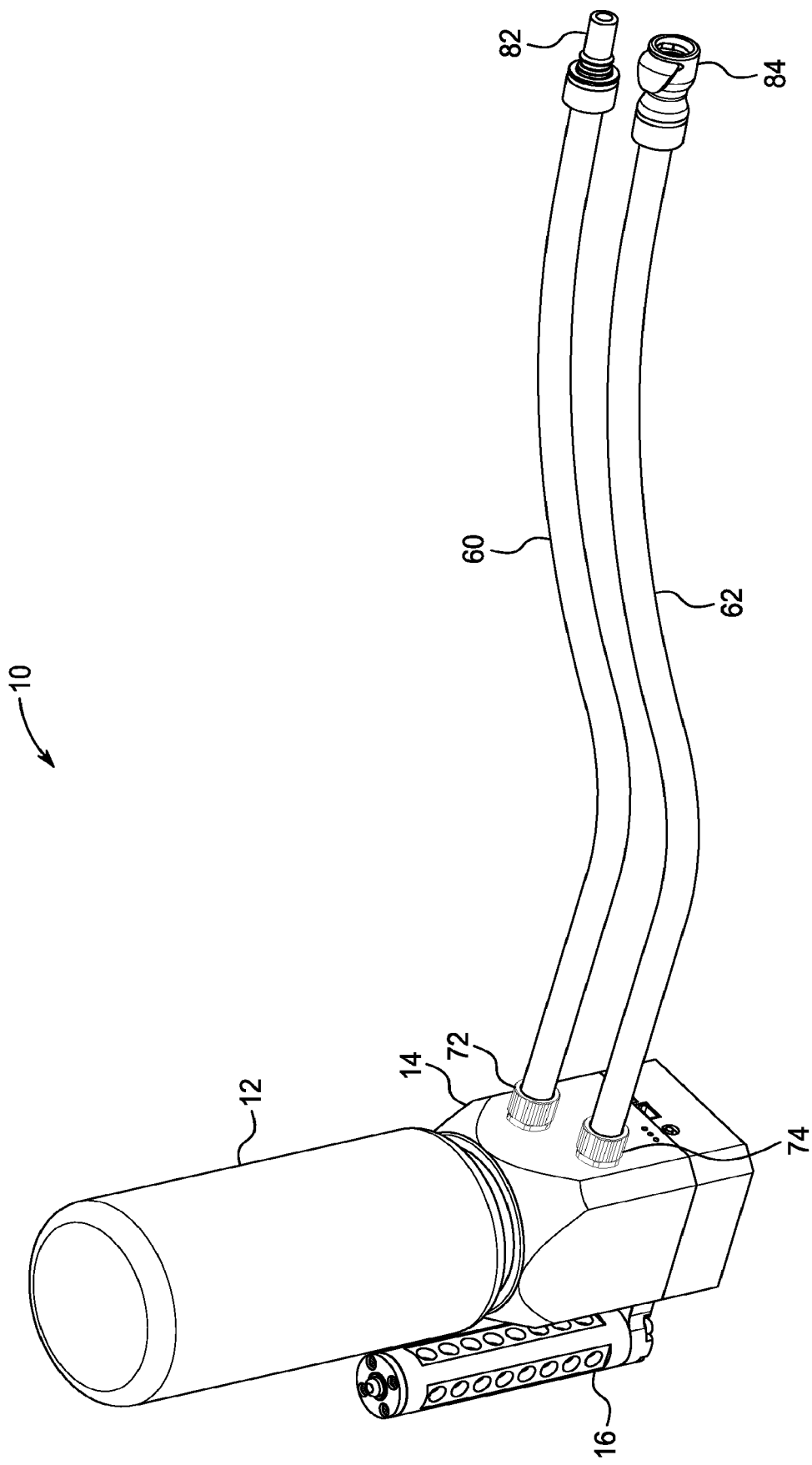
FIG. 9 is a perspective view of an embodiment of a pump driven coolant filling device with a container, a base and a handle with coolant hoses.
Figure 10:
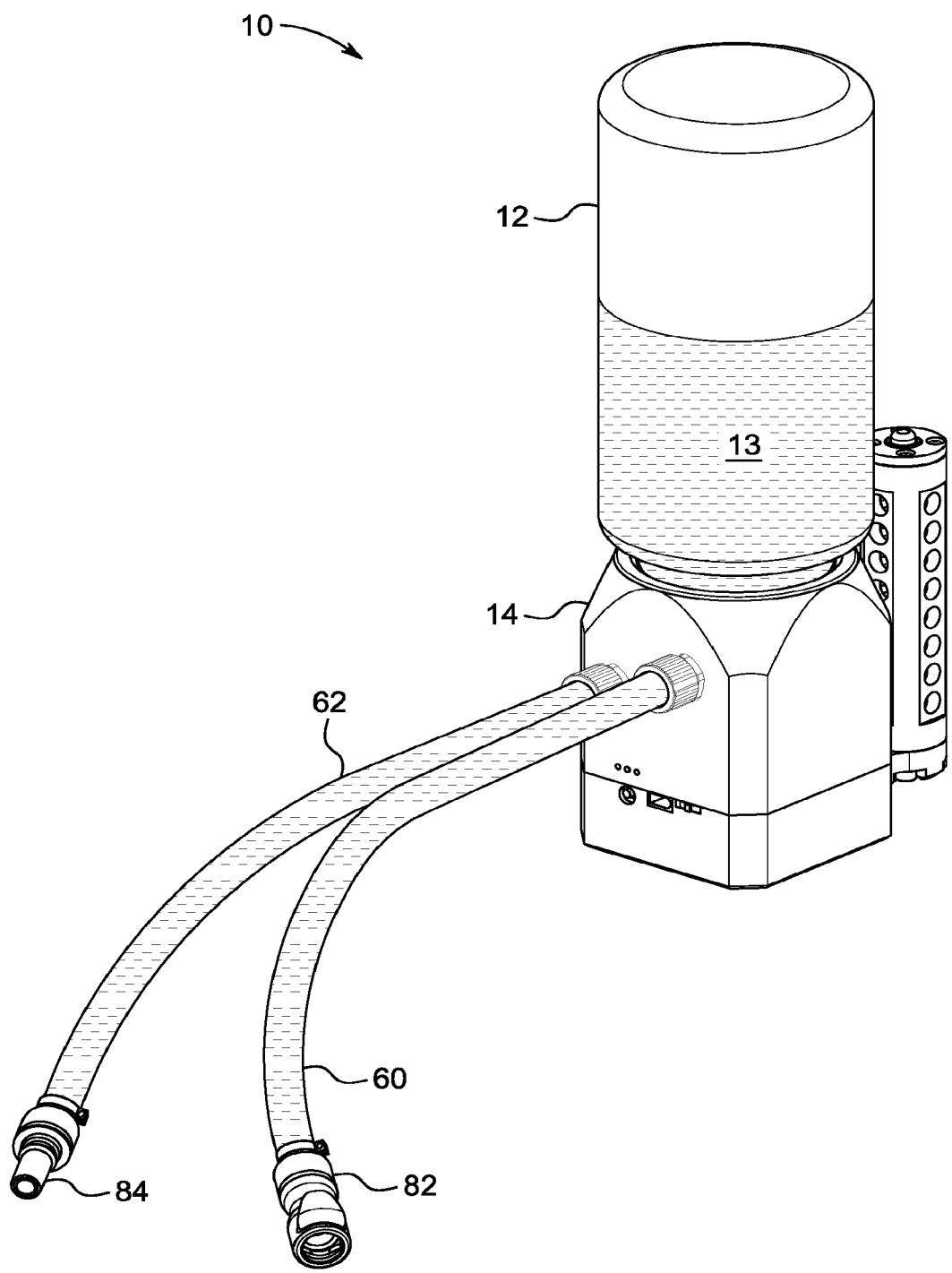
FIG. 10 is a perspective view of an embodiment of a pump driven coolant filling device with a container, a base and a handle with coolant hoses.
Figure 11:
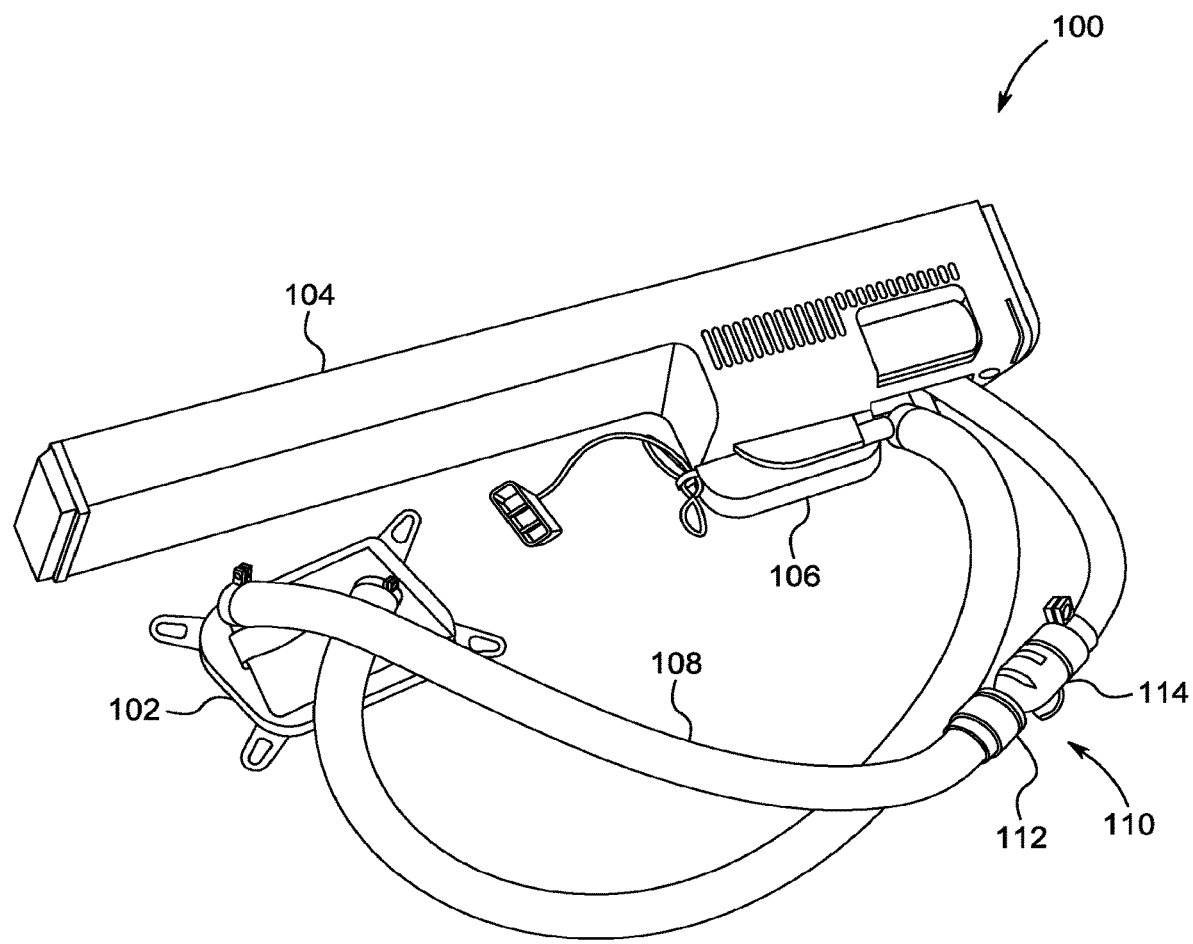
FIG. 11 is a perspective view of an embodiment of a coolant circuit configured for use with a pump driven coolant filling device.

Referring to FIGS. 8 and 9, in some embodiments, device 10 is configured for quick and efficient connection to an electronics cooling circuit. Container 12 is attached to base 14, and then the device 10 may be connected to a cooling circuit using hoses with quick connect fittings. Device 10 includes a first port hose fitting 72 disposed in first port 32, and a second port hose fitting 74 disposed in second port 34. Each of first and second port fittings 72, 74 are configured to be connected to a filling hose. For example, as shown in FIG. 9, a first hose 60, or first filling hose 60, is connected at one end to first port hose fitting 72. A first quick connect fitting 82, or first hose fitting 82, is disposed on the opposite end of first hose 60. Similarly, a second hose 62, or second filling hose 62, is connected at one end to second port hose fitting 74. A second quick connect fitting 84, or second hose fitting 82, is disposed on the opposite end of second hose 62. First and second quick connect fittings 82, 84 are configured to correspond to like quick connect fittings on a cooling circuit. In some embodiments, first quick connect fitting 82 is male, and second quick connect fitting 84 is female. In other embodiments, these are reversed.

By providing first and second quick connect fittings 82, 84 as male and female, or vice versa, a connecting point on cooling circuit comprising a male/female joint can be quickly disconnected and easily connected to first and second quick connect fittings 82, 84 on device 10. For example, as shown in FIGS. 10-13, a coolant circuit 100 includes a coolant block 102 that may be placed in thermal contact with a circuit component. First and second coolant hoses 108 are attached to coolant block 102 such that coolant may be passed through coolant block 102. Each coolant hose 108 is attached to a radiator 104 for extracting heat from the coolant. In some embodiments, radiator 104 includes an integrated pump 106 configured to circulate coolant through the cooling circuit 100. In other embodiments, pump 106 may be a separate component.

Figure 12:
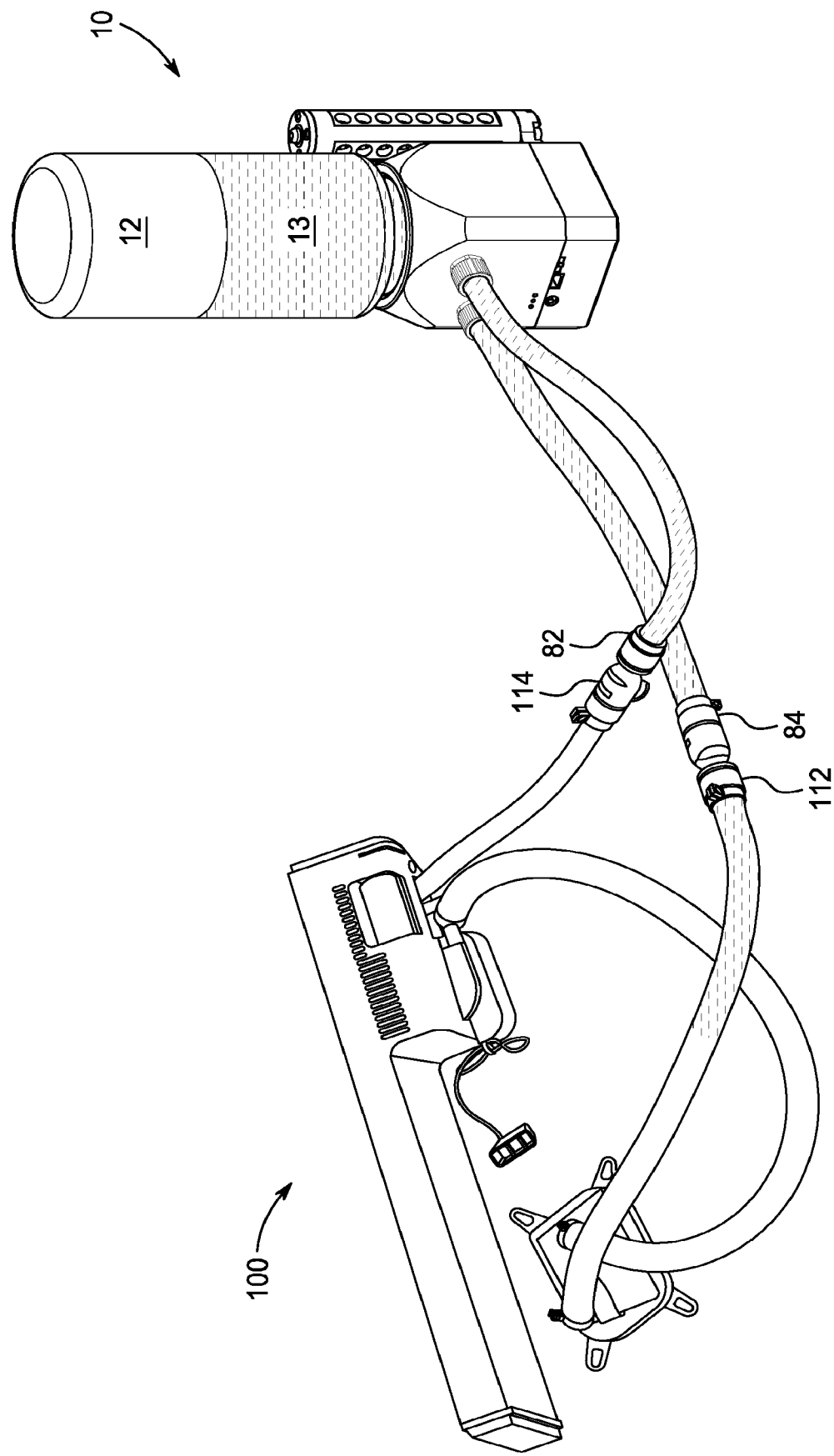
FIG. 12 is a perspective view of an embodiment of a pump driven coolant filling device attached to a coolant circuit.
Figure 13:
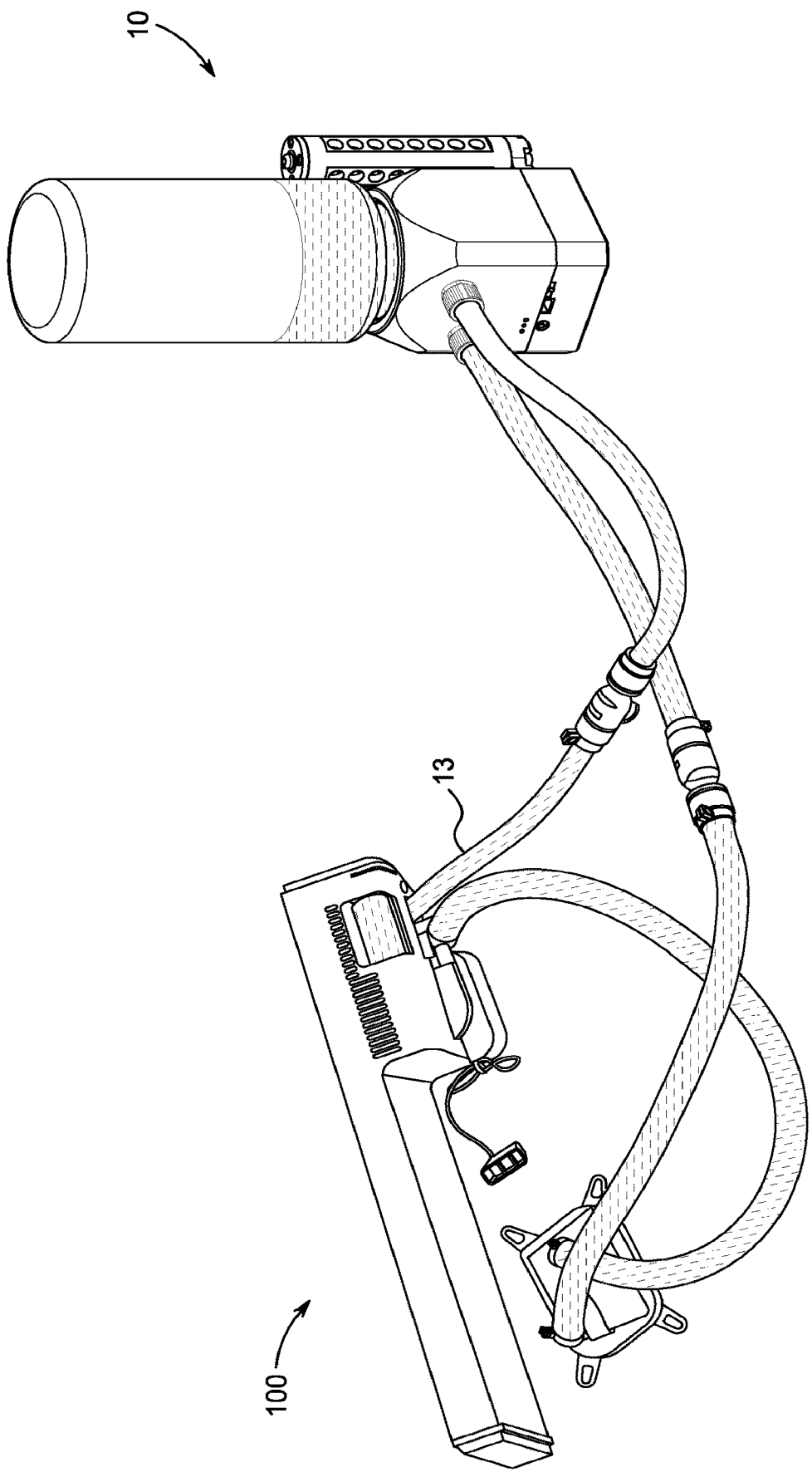
FIG. 13 is a perspective view of an embodiment of a pump driven coolant filling device attached to a coolant circuit.

One of the coolant hoses 108 includes a quick connect joint 110 including a male and a female quick connect fitting 112, 114. To add, remove or change coolant in the coolant circuit 100, pump 106 may be temporarily turned off, joint 110 may be separated, and first and second quick connect fittings 82, 84 on device 10 may be connected to the corresponding fittings 112, 114 on joint 110, as shown in FIG. 12 and FIG. 13. Once the device 10 is connected to cooling circuit 100, pump 40 may be activated on device 10 to circulate coolant 13 from container 12 into the cooling circuit 100. This method can be used to fill cooling circuit 100 if it is empty, to add some coolant to the coolant circuit if the volume is low, or to completely change out the coolant in coolant circuit 100 with new coolant 13 from container 12.

Figure 14:
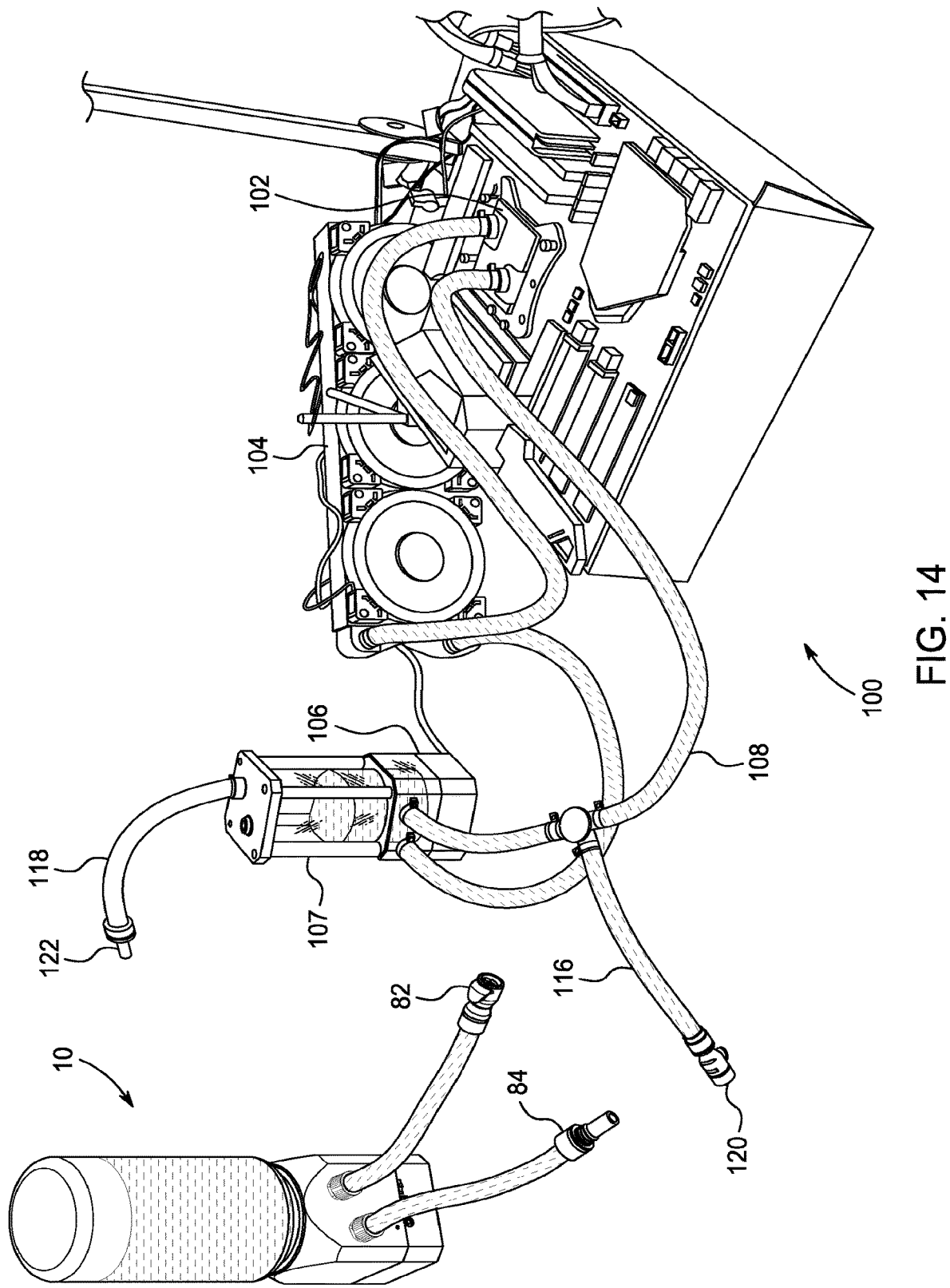
FIG. 14 is a perspective view of an embodiment of a pump driven coolant filling device and a coolant circuit configured for use with the pump driven coolant filling device.
Figure 15:
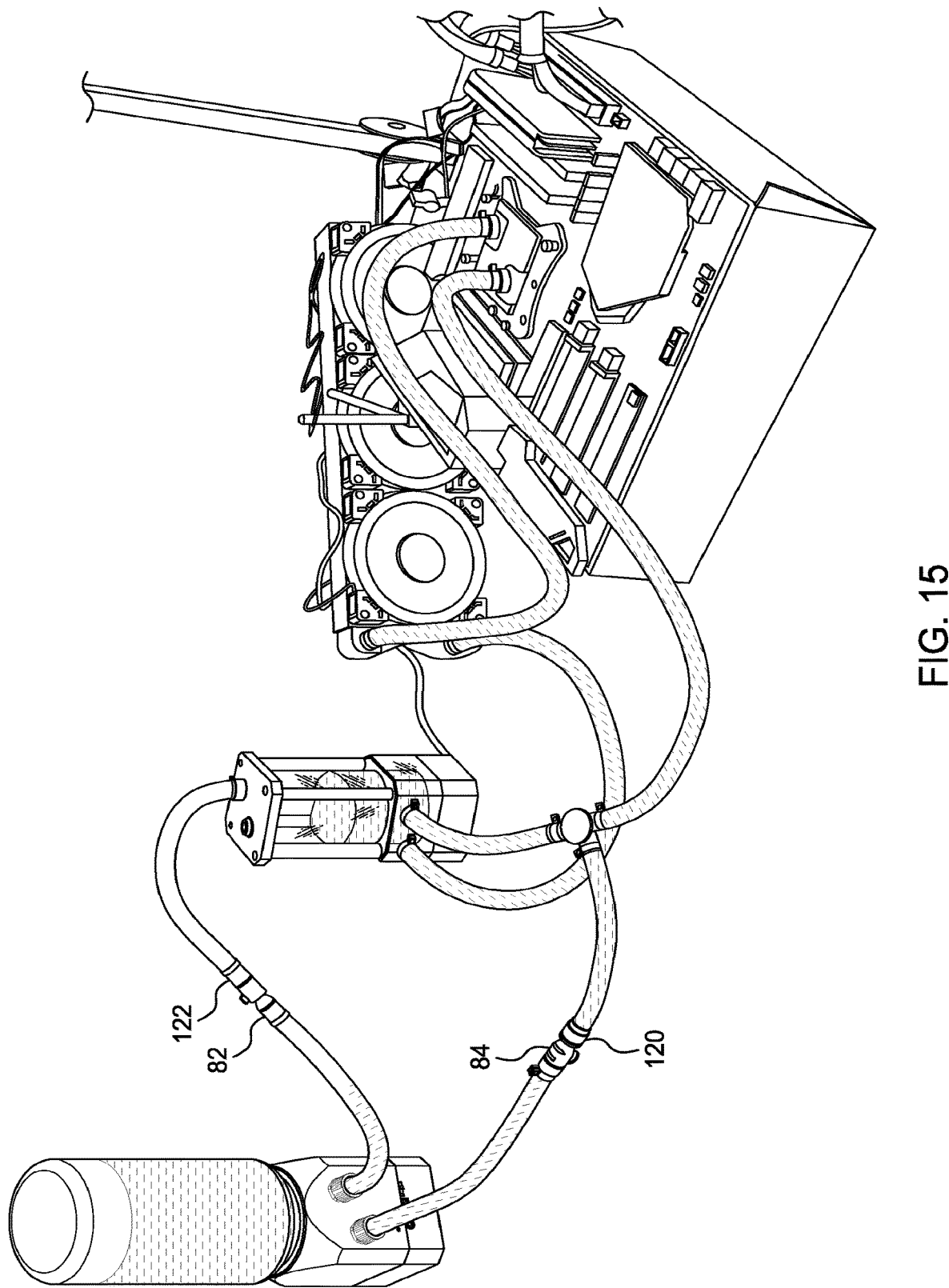
FIG. 15 is a perspective view of an embodiment of a coolant circuit attached to a pump driven coolant filling device.
Figure 16:
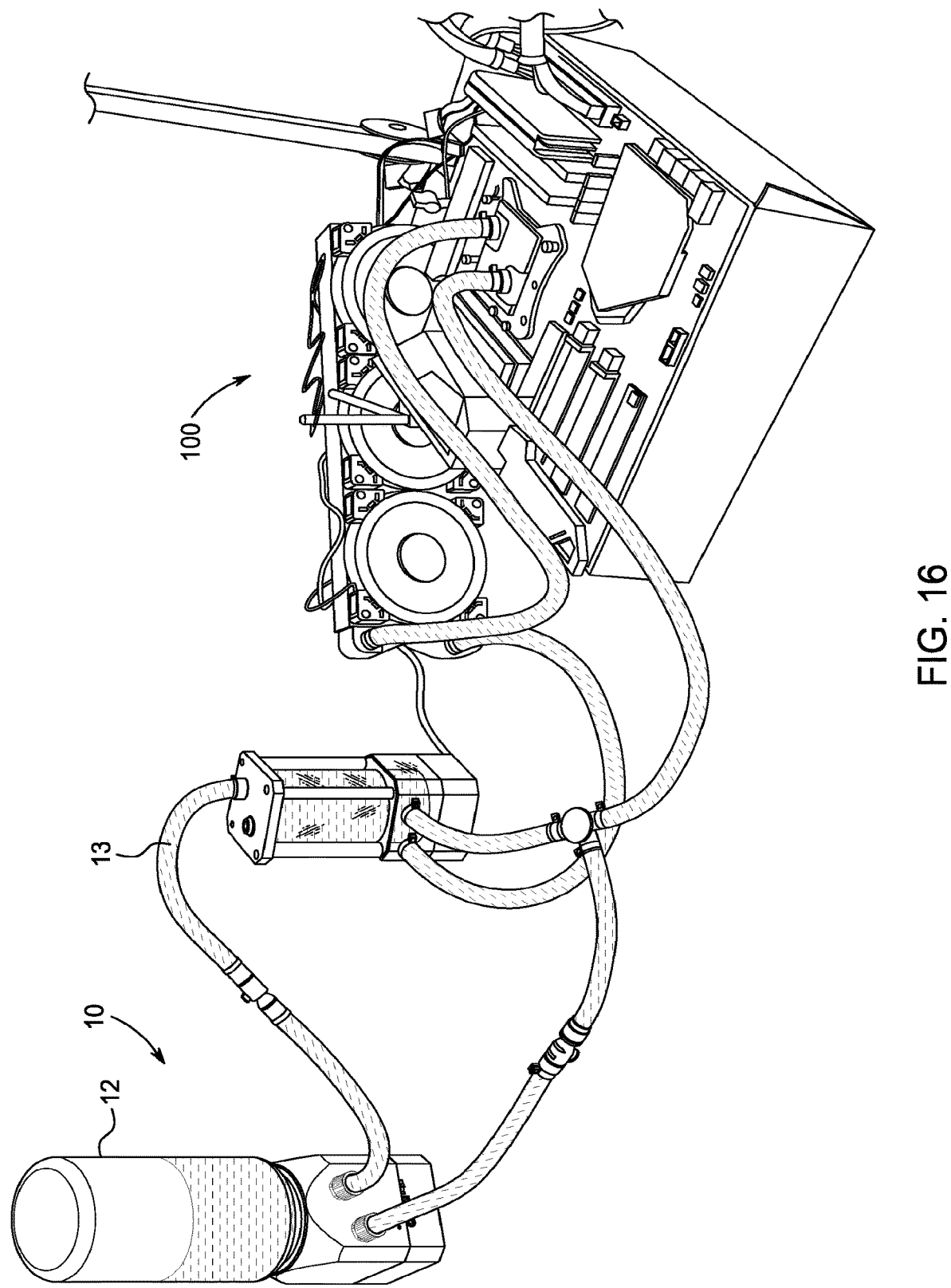
FIG. 16 is a perspective view of an embodiment of a coolant circuit attached to a pump driven coolant filling device.

In other embodiments, the present invention provides a device 10 and a coolant circuit 100 specifically configured for use with device 10 without having to power down the cooling circuit. For example, FIGS. 14-16 illustrate an embodiment of a device 10 and a cooling circuit 100. Cooling circuit 100 includes a coolant block 102 in thermal contact with a circuit component such as a processor or heat sink. A radiator 104 is connected to coolant block 102 via a plurality of hoses 108. A pump 106 circulates coolant through the radiator 104 and coolant block 102 in a closed loop. In some embodiments, a reservoir 107 stores excess coolant in the closed-loop system maintaining a steady volume of coolant in the cooling circuit. During use, coolant level in reservoir 107 may become low and need to be refilled. The system of the present invention provides a solution for filling the coolant in the reservoir 107 without turning off circulation of the closed-loop cooling circuit 100.

The system includes a first transfer hose 116 connected to coolant circuit hose 108 at a T-junction. First transfer hose 116 includes a first transfer coupling 120 disposed on its distal end. First transfer coupling 120 includes a closed valve when disconnected from other couplings. Similarly, a second transfer hose 118 is connected to the coolant circuit at a second location. In some embodiments, second transfer hose 118 is connected to the reservoir 107. A second transfer coupling 122 is disposed on the distal end of second transfer hose 118 in some embodiments. Second transfer coupling 122 includes a closed valve when disconnected from other couplings.

During use, device 10 may be connected to coolant circuit 100 by joining first and second quick connect couplings 82, 84 on device 10 to first and second transfer couplings 120, 122 on cooling circuit 100. For example, as shown in FIG. 15, first quick connect coupling 82 on device 10 is attached to second transfer coupling 122 on reservoir 107, and second quick connect coupling 84 on device 10 is attached to first transfer coupling 120 on circuit 100. These may also be reversed in other embodiments. When the device couplings are attached to the circuit couplings as shown in FIG. 15, each coupling is opened thereby allowing fluid to flow between device 10 and circuit 100. From this position, the pump on device 10 may be activated using handle button 18 to use positive or negative pressure to force coolant 13 from container 12 into circuit 100, thereby filling reservoir 107 with additional coolant until all the air in circuit 100 is evacuated and the closed loop system in circuit 100 is full of coolant. From this configuration, the quick connect couplings between device 10 and circuit 100 may be detached. This filling method may be performed while coolant is still circulating through circuit 100. Alternatively, circulation in circuit 100 may be turned off during filling.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative aspects. Accordingly, all such modifications are intended to be included within the scope of the present disclosure as defined in the appended claims.

The foregoing description of aspects of the invention aspect has been presented for purposes of illustration and description. It is not intended to be exhaustive or to limit the disclosure to the precise form disclosed, and modifications and variations are possible in light of the above teachings or may be acquired from this disclosure. The aspects were chosen and described in order to explain the principals of the disclosure and its practical application to enable one skilled in the art to utilize the various aspects and with various modifications as are suited to the particular use contemplated. Other substitutions, modifications, changes and omissions may be made in the design, operating conditions and arrangement of the aspects without departing from the scope of the present disclosure as expressed in the appended claims

What is claimed is:

1. A system for cooling a circuit component, comprising:
a closed-loop cooling circuit comprising a coolant block, a first pump and a radiator; and
a coolant filling device comprising a container, a base and a second pump disposed inside the base, wherein the coolant filling device is configured for attachment to the cooling circuit;
a container socket defined in the base;
a first orifice defined in the base in the container socket, the first orifice in fluid communication with a first filling port on the base; and
a second orifice defined in the base in the container socket, the second orifice in fluid communication with a second filling port on the base,
wherein when the coolant filling device is attached to the cooling circuit, coolant may be circulated from the coolant filling device to the cooling circuit while the cooling circuit circulates coolant.

2. The system of claim 1, comprising first and second filling hoses disposed on the base.

3. The system of claim 2, comprising:
a first hose fitting disposed on the first filling hose; and
a second hose fitting disposed on the second filling hose.

4. The system of claim 3, further comprising:
a first transfer coupling disposed on the cooling circuit; and
a second transfer coupling disposed on the cooling circuit.

5. The system of claim 4, wherein the first hose fitting is configured to detachably engage the first transfer coupling in fluid communication, and the second hose fitting is configured to detachably engage the second transfer coupling in fluid communication.

6. The system of claim 1, further comprising:
a power supply disposed on the base; and
a switch operable to selectively turn the pump on and off.

7. The system of claim 6, wherein the second pump is a centrifugal pump.

8. The system of claim 1, the cooling circuit further comprising a coolant reservoir.

9. The system of claim 8, further comprising:
a first filling hose disposed on the base;
a second filling hose disposed on the base;
a first hose fitting disposed on the first filling hose; and
a second hose fitting disposed on the second filling hose.

10. The system of claim 9, further comprising:
a first transfer hose disposed on the cooling circuit;
a first transfer coupling disposed on the first transfer hose;
a second transfer hose disposed on the cooling circuit; and
a second transfer coupling disposed on the second transfer hose.

11. The system of claim 10, wherein the first hose fitting is configured to detachably engage the first transfer coupling in fluid communication, and the second hose fitting is configured to detachably engage the second transfer coupling in fluid communication.

12. The system of claim 10, wherein the second transfer hose is attached to the coolant reservoir.

13. The system of claim 10, further comprising:
a power supply disposed on the base; and
a switch operable to selectively turn the pump on and off.

14. The system of claim 1, wherein the second pump is a centrifugal pump.

15. A system for cooling a circuit component on an electronic device, comprising:
a closed-loop cooling circuit comprising a coolant block, a first pump and a radiator; and
a coolant filling device comprising a container, a base and a second pump disposed inside the base, wherein the coolant filling device is configured for attachment to the cooling circuit,
a container socket defined in the base;
a first orifice defined in the base in the container socket, the first orifice in fluid communication with a first filling port on the base; and
a second orifice defined in the base in the container socket, the second orifice in fluid communication with a second filling port on the base,
wherein the cooling circuit and the coolant filling device are both configured such that, when the coolant filling device is attached to the cooling circuit, coolant may be circulated from the coolant filling device to the cooling circuit while coolant circulates through the cooling circuit.

16. The system of claim 15, wherein the cooling circuit and the coolant filling device are configured such that, when the coolant filling device is attached to the cooling circuit, coolant may be circulated from the coolant filling device to the cooling circuit while the electronic device remains powered on.

17. The system of claim 16, further comprising:
a first filling hose disposed on the base;
a second filling hose disposed on the base;
a first hose fitting disposed on the first filling hose; and
a second hose fitting disposed on the second filling hose.

18. The system of claim 17, further comprising:
a first transfer hose disposed on the cooling circuit;
a first transfer coupling disposed on the first transfer hose;
a second transfer hose disposed on the cooling circuit; and
a second transfer coupling disposed on the second transfer hose.

19. The system of claim 18, wherein the first hose fitting is configured to detachably engage the first transfer coupling in fluid communication, and the second hose fitting is configured to detachably engage the second transfer coupling in fluid communication.

20. The system of claim 19, further comprising a coolant reservoir on the cooling circuit.

* * * * *